US012205990B2

(12) United States Patent
Uchida

(10) Patent No.: US 12,205,990 B2
(45) Date of Patent: Jan. 21, 2025

(54) METHOD OF MANUFACTURING SILICON CARBIDE SEMICONDUCTOR DEVICE AND SILICON CARBIDE SEMICONDUCTOR DEVICE

(71) Applicant: FUJI ELECTRIC CO., LTD., Kawasaki (JP)

(72) Inventor: Takafumi Uchida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 247 days.

(21) Appl. No.: 17/726,980

(22) Filed: Apr. 22, 2022

(65) Prior Publication Data

US 2022/0393002 A1   Dec. 8, 2022

(30) Foreign Application Priority Data

Jun. 7, 2021   (JP) .................................. 2021-095367

(51) Int. Cl.
*H01L 29/16*   (2006.01)
*H01L 21/02*   (2006.01)
*H01L 21/324*   (2006.01)
*H01L 29/36*   (2006.01)

(52) U.S. Cl.
CPC .... *H01L 29/1608* (2013.01); *H01L 21/02378* (2013.01); *H01L 21/324* (2013.01); *H01L 29/36* (2013.01)

(58) Field of Classification Search
None
See application file for complete search history.

(56) References Cited

U.S. PATENT DOCUMENTS

| 2018/0197983 A1 | 7/2018 | Kinoshita et al. | |
| 2022/0109049 A1* | 4/2022 | Miyazato | H01L 29/0878 |
| 2022/0231128 A1* | 7/2022 | Fujikake | H01L 29/0623 |

FOREIGN PATENT DOCUMENTS

WO   2017/064949 A1   4/2017

* cited by examiner

*Primary Examiner* — Jack S Chen
(74) *Attorney, Agent, or Firm* — Rabin & Berdo, P.C.

(57) ABSTRACT

On a silicon carbide semiconductor substrate of a first conductivity type, a first semiconductor layer of the first conductivity type, a second semiconductor layer of a second conductivity type, first semiconductor regions of the first conductivity type, second semiconductor regions of the second conductivity type, a gate insulating film, gate electrodes, an interlayer insulating film, first electrodes, and a second electrode are formed. Each of the first electrodes are formed by depositing a lower Ni film, an Al film, and an upper Ni film and etching the films to be apart from the interlayer insulating film; sintering the lower Ni film by a heat treatment and thereby forming a Ni silicide film; depositing a Ti film, a TiN film, and an AlSi film; and etching the AlSi film.

7 Claims, 13 Drawing Sheets

METHOD OF MANUFACTURING SILICON CARBIDE SEMICONDUCTOR DEVICE AND SILICON CARBIDE SEMICONDUCTOR DEVICE

CROSS REFERENCE TO RELATED APPLICATIONS

This application is based upon and claims the benefit of priority of the prior Japanese Patent Application No. 2021-095367, filed on Jun. 7, 2021, the entire contents of which are incorporated herein by reference.

BACKGROUND OF THE INVENTION

1. Field of the Invention

Embodiments of the invention relate to a method of manufacturing a silicon carbide semiconductor device and a silicon carbide semiconductor device.

2. Description of the Related Art

Silicon carbide (SiC) is expected as a next generation semiconductor material to replace silicon (Si). Compared to a conventional semiconductor device element using silicon as a semiconductor material, a semiconductor device element using silicon carbide as a semiconductor material (hereinafter, silicon carbide semiconductor device) has various advantages such as enabling resistance of a device element in an ON state to be reduced to a few hundredths and application under higher temperature (at least 200 degrees C.) environments. These advantages are due to characteristics of the material itself in that a band gap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is a MOS gate structure in which a MOS gate is provided in a flat plate-like shape on a front surface of a semiconductor substrate. A trench gate structure is a MOS gate structure in which a MOS gate is embedded in a trench formed in a semiconductor substrate (semiconductor chip), at a front surface thereof and a channel (inversion layer) is formed along a sidewall of the trench in a direction orthogonal to the front surface of the semiconductor substrate. Therefore, compared to the planar gate structure in which a channel is formed along the front surface of the semiconductor substrate, unit cell (constituent unit of device element) density per unit area may be increased and current density per unit area may be increased, which are advantageous in terms of cost.

FIG. 10 is a cross-sectional view depicting a structure of a conventional silicon carbide semiconductor device. The structure of the conventional silicon carbide semiconductor device is described taking a trench-type MOSFET 170 as an example. In the trench-type MOSFET 170, an n$^-$-type silicon carbide epitaxial layer 102 is deposited on a front surface of an n$^+$-type silicon carbide substrate 101. At a first surface side of the n$^-$-type silicon carbide epitaxial layer 102, opposite to a second surface side thereof facing the n$^+$-type silicon carbide substrate 101, an n-type high-concentration region 105 is provided. In a surface layer of the n-type high-concentration region 105, first p$^+$-type base regions 103 are selectively provided between trenches 116. Further, in the n-type high-concentration region 105, a second p$^+$-type base region 104 is selectively provided so as to underlie an entire area of the bottom of each of the trenches 116.

MOS gates of the trench gate structure are configured by a p-type base layer 106, n$^+$-type source regions 107, p$^+$-type contact regions 108, the trenches 116, a gate insulating film 109, and gate electrodes 110. Hereinafter, the n$^+$-type silicon carbide substrate 101, the n$^-$-type silicon carbide epitaxial layer 102, the n-type high-concentration region 105, and the p-type base layer 106 combined constitute a silicon carbide semiconductor base 118.

Further, an interlayer insulating film 111 is provided on the gate electrodes 110, and a Ni silicide film 115 constituting source electrodes 112 that are in contact with the n$^+$-type source regions 107 and the p$^+$-type contact regions 108 is provided in openings of the interlayer insulating film 111. A Ti/TiN film 114 that constitutes a barrier metal that prevents diffusion of metal atoms to the gate electrodes 110 is provided on the Ni silicide film 115 and the interlayer insulating film 111. An AlSi film 119 that constitutes a source electrode pad is provided on the Ti/TiN film 114. A back electrode 113 constituting a drain electrode is provided on a back surface of the n$^+$-type silicon carbide substrate 101.

In the conventional silicon carbide semiconductor device, the Ni silicide film 115, the Ti/TiN film 114, and the AlSi film 119 are formed as follows. FIGS. 11, 12, and 13 are cross-sectional views depicting states of the conventional silicon carbide semiconductor device during manufacture. FIG. 11 depicts a state during manufacture of the semiconductor device, after formation of the interlayer insulating film 111.

After formation of the interlayer insulating film 111, a Ni (nickel) film 121 is deposited on an entire area of the front surface of the silicon carbide semiconductor base 118 by sputtering. Next, a first sintering is performed. Here, temporary sintering is performed at a relatively low temperature of about 600 degrees C. so that the interlayer insulating film 111 and Ni do not react with each other. Next, after the first sintering, the Ni film 121 is patterned by photolithography and removed from the interlayer insulating film 111. The state up to here is depicted in FIG. 12.

Next, a second sintering is performed. The second sintering is performed at a higher temperature than that of the first sintering, about 975 degrees C., whereby the Ni silicide film 115 is formed by a reaction of the Ni and SiC. Next, titanium (Ti) and titanium nitride (TiN) are deposited by sputtering, thereby forming the Ti/TiN film 114 and next, AlSi is deposited by sputtering, thereby forming the AlSi film 119. Thereafter, the AlSi film 119 is patterned by photolithography. The state up to here is depicted in FIG. 13. In this manner, the Ni silicide film 115, the Ti/TiN film 114, and the AlSi film 119 are formed.

Further, a semiconductor device is known in which pn junctions between first and second p-type base regions and an n-type drift layer are formed, whereby application of high electric field to the gate insulating film at the trench bottoms may be prevented and even in an instance in which a wide band gap semiconductor is used as a semiconductor material, high breakdown voltage is possible (for example, refer to International Publication No. WO 2017/064949).

SUMMARY OF THE INVENTION

According to an embodiment to the invention, a method of manufacturing a silicon carbide semiconductor device includes: preparing a silicon carbide semiconductor substrate of a first conductivity type, the silicon carbide semiconductor substrate having a first main surface and a second main surface that are opposite to each other; forming, on the first main surface of the silicon carbide semiconductor substrate, a first semiconductor layer of the first conductivity type, the first semiconductor layer having an impurity concentration that is lower than an impurity concentration of the silicon carbide semiconductor substrate, the first semiconductor layer having a first surface and a second surface that are opposite to each other, the second surface facing the silicon carbide semiconductor substrate; forming, on the first surface of the first semiconductor layer, a second semiconductor layer of a second conductivity type, the second semiconductor layer having a first surface and a second surface that are opposite to each other, the second surface facing the silicon carbide semiconductor substrate; selectively forming, in the second semiconductor layer, at the first surface thereof, a plurality of first semiconductor regions of the first conductivity type; selectively forming, in the second semiconductor layer, at the first surface thereof, a plurality of second semiconductor regions of the second conductivity type, in contact with the first semiconductor regions; forming a gate electrode to be in contact with, via a gate insulating film, at least a portion of the second semiconductor layer positioned between the first semiconductor regions and the first semiconductor layer; forming an interlayer insulating film so as to cover the gate electrode; forming a plurality of first electrodes at surfaces of the first semiconductor regions and the second semiconductor regions; and forming a second electrode on the second main surface of the silicon carbide semiconductor substrate. Forming each of the plurality of first electrodes includes: depositing a lower Ni film, an Al film, and an upper Ni film above the first surface of the second semiconductor layer and etching the lower Ni film, the Al film, and the upper Ni film, so as to be apart from the interlayer insulating film, as a depositing and etching process; sintering the lower Ni film by a heat treatment and thereby forming a Ni silicide film; depositing a Ti film, a TiN film, and an AlSi film above the first surface of the second semiconductor layer; and etching the AlSi film.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
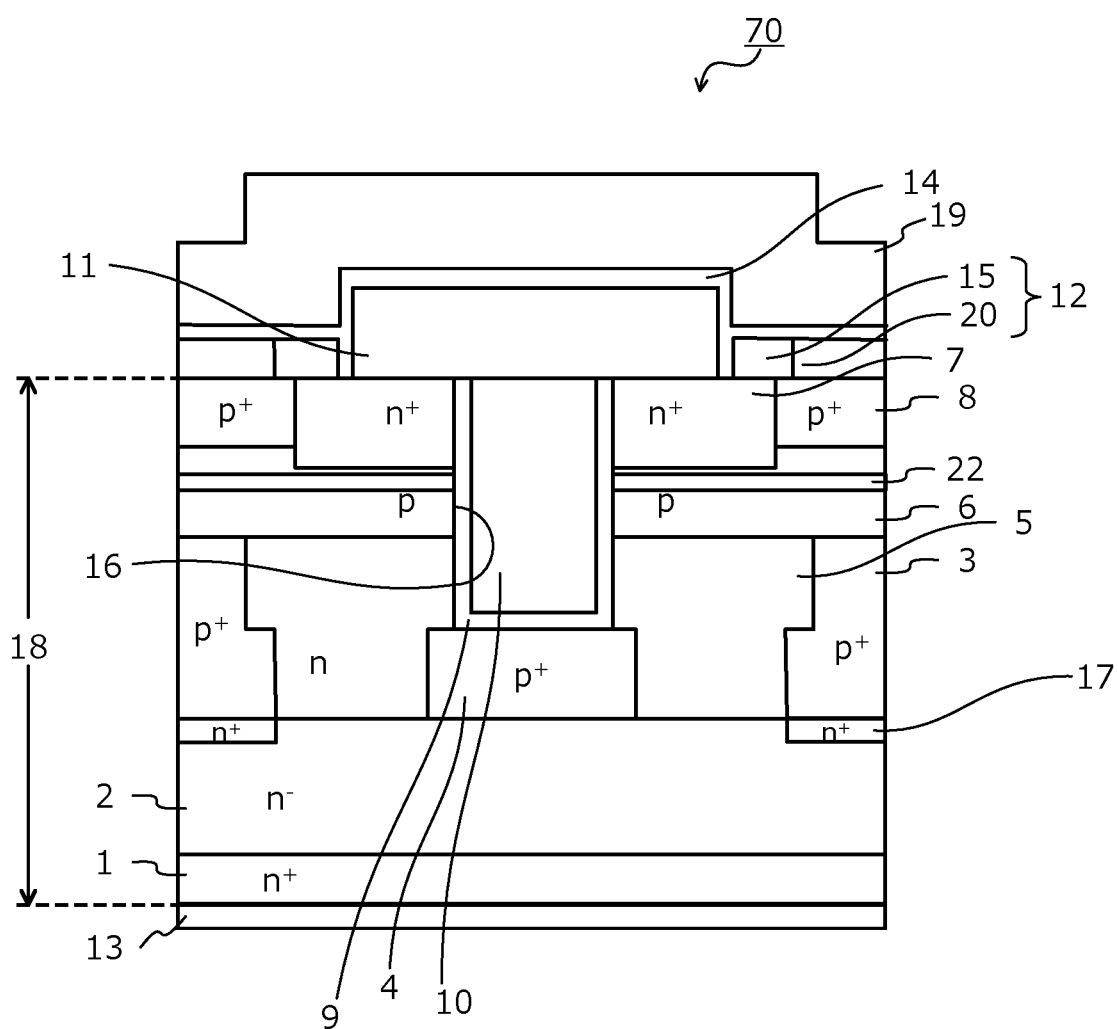
FIG. 1 is a cross-sectional view depicting a structure of a silicon carbide semiconductor device according to an embodiment.

First, problems associated with the conventional techniques are discussed. As described above, conventionally, the Ni film 121 is formed on upper portions of the $p^+$-type contact regions 108 and the n-type source regions 107, the Ni silicide film 115 is formed by a heat treatment, and thereafter, excess Ni is removed. In this manner, the Ni silicide film 115 in which contact resistance is reduced is formed in both the $n^+$-type source regions 107 (source regions) and the $p^+$-type contact regions 108 (contact regions).

Here, regarding the silicon carbide semiconductor device, screening is performed after manufacture and only products having prescribed electrical characteristics are shipped. As the screening after manufacture, in a silicon carbide MOSFET, the screening is performed by passing current through a built-in diode. At this time, preferably, the screening is performed in a short period by passing large current through the p-type contact regions 108. When forward voltage (VF) is high, heat is generated and large current cannot pass, therefore, it is desirable to lower the VF of the built-in diode.

However, the conventional silicon carbide semiconductor device has a problem in that the same Ni silicide film 115 is in contact with the upper portions of the $p^+$-type contact regions 108 and the $n^+$-type source regions 107 and therefore, the VF of the built-in diode cannot be lowered.

Embodiments of a method of manufacturing a silicon carbide semiconductor device and a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 2:
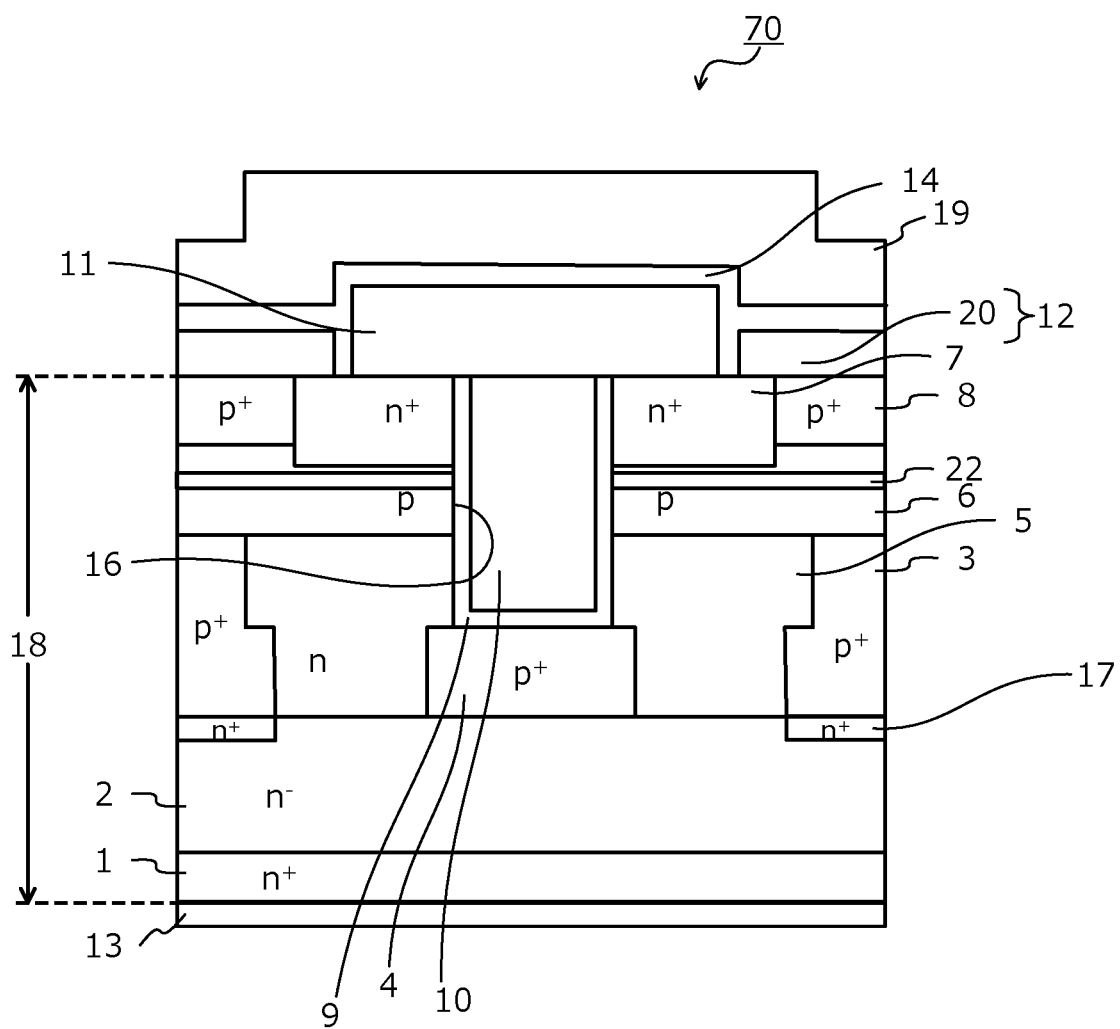
FIG. 2 is a cross-sectional view depicting the structure of the silicon carbide semiconductor device according to the embodiment.
Figure 3:
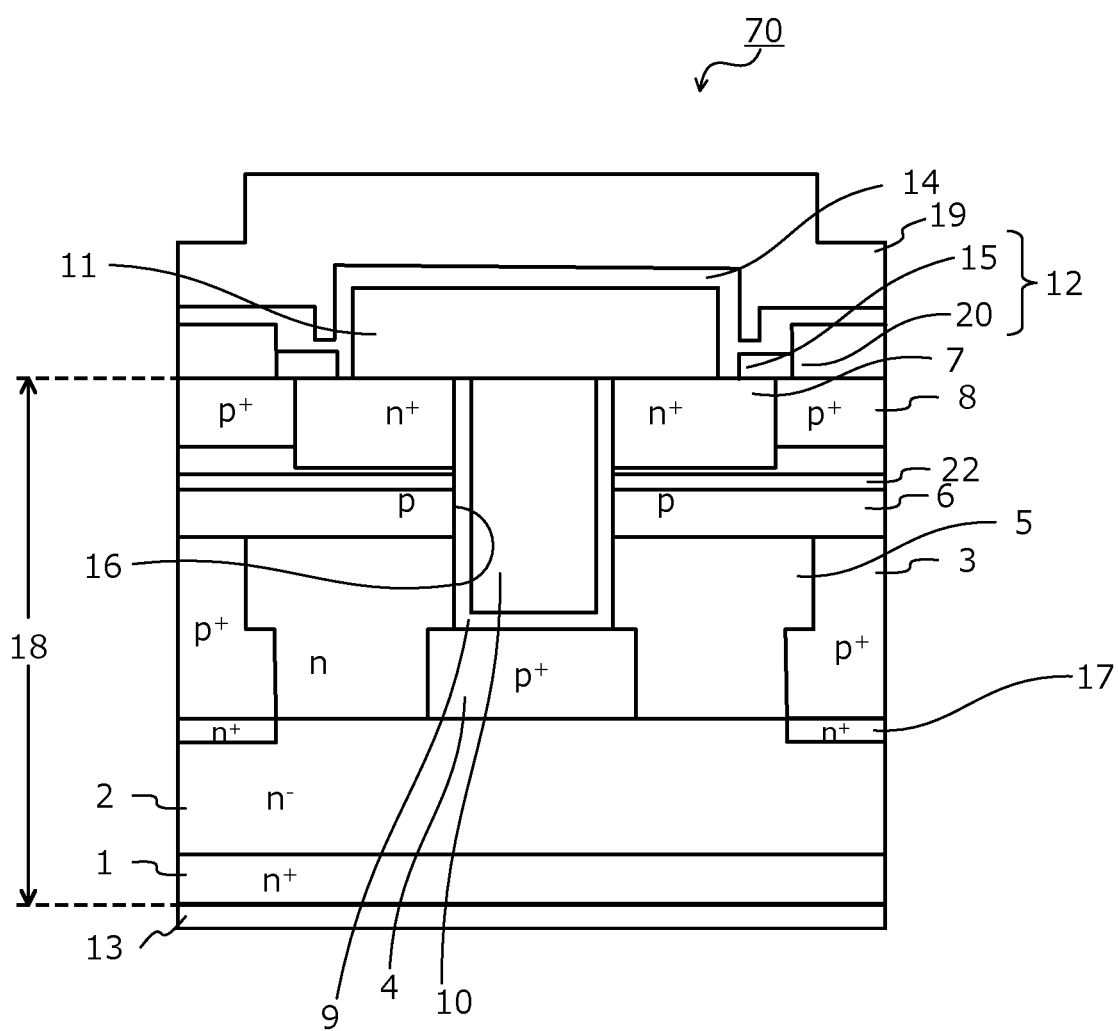
FIG. 3 is a cross-sectional view depicting the structure of the silicon carbide semiconductor device according to the embodiment.

A semiconductor device according to the present invention is configured using a wide band gap semiconductor. In an embodiment, a trench-type MOSFET 70 is described as an example of a silicon carbide semiconductor device fabricated (manufactured) using, for example, silicon carbide (SiC) as the wide band gap semiconductor. FIGS. 1, 2, and 3 are cross-sectional views depicting a structure of the silicon carbide semiconductor device according to an embodiment. In FIGS. 1 to 3, only an active region through which a main current of the trench-type MOSFET 70 flows is depicted.

As depicted in FIG. 1, in the silicon carbide semiconductor device according to the embodiment, an n$^-$-type silicon carbide epitaxial layer (first semiconductor layer of a first conductivity type) 2 is deposited on a first main surface (front surface), for example, a (0001) plane (Si-face) of an n$^+$-type silicon carbide substrate (silicon carbide semiconductor substrate of the first conductivity type) 1.

The n$^+$-type silicon carbide substrate 1 is a silicon carbide single crystal substrate. The n$^-$-type silicon carbide epitaxial layer 2 has an impurity concentration that is lower than that of the n$^+$-type silicon carbide substrate 1 and, for example, constitutes a low-concentration n-type drift layer. At a first surface of the n-type silicon carbide epitaxial layer 2, opposite to a second surface thereof facing the n$^+$-type silicon carbide substrate 1, an n-type high-concentration region 5 may be provided. The n-type high-concentration region 5 constitutes a high-concentration n-type drift layer and has an impurity concentration that is lower than that of the n$^+$-type silicon carbide substrate 1 and higher than that of the n$^-$-type silicon carbide epitaxial layer 2.

On the first surface of the n$^-$-type silicon carbide epitaxial layer 2, opposite to the second surface thereof facing the n$^+$-type silicon carbide substrate 1, a p-type base layer (second semiconductor layer of a second conductivity type) 6 is provided. Hereinafter, the n$^+$-type silicon carbide substrate 1, the n$^-$-type silicon carbide epitaxial layer 2, the n-type high-concentration region 5, and the p-type base layer 6 combined constitute a silicon carbide semiconductor base (semiconductor substrate containing silicon carbide) 18.

On a second main surface (back surface, i.e., back surface of the silicon carbide semiconductor base 18) of the n$^+$-type silicon carbide substrate 1, a drain electrode constituting a back electrode (second electrode) 13 is provided. On a surface of the back electrode 13, a drain electrode pad (not depicted) is provided.

A trench structure is formed in the silicon carbide semiconductor base 18, at a first main surface side (side having the p-type base layer 6) thereof. In particular, from a first surface (first main surface side of the silicon carbide semiconductor base 18) of the p-type base layer 6, opposite to a second surface thereof facing the n$^+$-type silicon carbide substrate 1, trenches 16 penetrate the p-type base layer 6 and reach the n-type high-concentration region 5 (in an instance in which the n-type high-concentration region 5 is omitted, the n$^-$-type silicon carbide epitaxial layer 2, hereinafter, simply "(2)"). Along inner walls of the trenches 16, a gate insulating film 9 is formed on the bottoms and sidewalls of the trenches 16, and gate electrodes 10 are formed on the gate insulating film 9 in the trenches 16. The gate electrodes 10 are insulated from the n-type high-concentration region 5 (2) and the p-type base layer 6 by the gate insulating film 9. A portion of each of the gate electrodes 10 may protrude toward source electrodes (first electrodes) 12, from tops (side where the later-described source electrodes 12 are provided) of the trenches 16.

In the n-type high-concentration region 5 (2), at a first surface thereof (the first main surface side of the silicon carbide semiconductor base 18), opposite to a second surface thereof facing the n$^+$-type silicon carbide substrate 1, first p$^+$-type base regions 3 are provided between the trenches 16. Further, second p$^+$-type base regions 4 that are in contact with the bottoms of the trenches 16 are provided in the n-type high-concentration region 5 (2). The second p$^+$-type base regions 4 are provided at locations that face the trenches 16 in a depth direction (direction from the source electrodes 12 to the back electrode 13). A width of each of the second p$^+$-type base regions 4 is equal to or wider than a width of each of the trenches 16. The bottoms of the trenches 16 may reach the second p$^+$-type base regions 4 or may reach positions in the n-type high-concentration region 5 (2), between the p-type base layer 6 and the second p$^+$-type base regions 4.

In the p-type base layer 6, n$^+$-type source regions (first semiconductor regions of the first conductivity type) 7 and p$^+$-type contact regions (second semiconductor regions of the second conductivity type) 8 are selectively provided at the first main surface side of the silicon carbide semiconductor base 18. Further, the n$^+$-type source regions 7 and the p$^+$-type contact regions 8 are in contact with one another.

Here, to adjust a threshold voltage (Vth), ion implantation is performed in a region in which a channel of the p-type base layer 6 is formed. As a result, an implanted channel portion 22 having an impurity concentration increased to be higher than that of the p-type base layer 6 is formed.

Further, to increase the breakdown voltage, n$^+$-type regions 17 are provided in the n$^-$-type silicon carbide epitaxial layer 2, at positions deeper than are the first p$^+$-type base regions 3 between the trenches 16, the n$^+$-type regions 17 having a peak impurity concentration that is higher than that of the n-type high-concentration region 5 (2). Here, a deep position is a position that is closer to the back electrode 13 than are the first p$^+$-type base regions 3.

An interlayer insulating film 11 is provided on an entire surface of the first main surface side of the silicon carbide semiconductor base 18, so as to cover the gate electrodes 10 embedded in the trenches 16. The source electrodes 12 are in contact with the n$^+$-type source regions 7 and the p$^+$-type contact regions 8 via contact holes opened in the interlayer insulating film 11. In the embodiment, the source electrodes 12 are constituted by Ni silicide films 15 and NiAl silicide films 20.

For example, as depicted in FIG. 1, the NiAl silicide films 20 are in contact with the p$^+$-type contact regions 8 and the Ni silicide films 15 are provided so as to be in contact with the n$^+$-type source regions 7. Here, the Ni silicide films 15 are not in contact with the interlayer insulating film 11. Borders between the Ni silicide films 15 and the NiAl silicide films 20 may be above the n$^+$-type source regions 7 or may be above the p$^+$-type contact regions 8.

Further, as depicted in FIG. 2, the NiAl silicide films 20 may be provided above both the p$^+$-type contact regions 8 and the n$^+$-type source regions 7. In this instance, the NiAl silicide films 20 are apart from the interlayer insulating film 11. Further, as depicted in FIG. 3, the NiAl silicide films 20 may be provided to be thicker than the Ni silicide films 15. In this case, the NiAl silicide films 20 are in contact with the p$^+$-type contact regions 8 while the Ni silicide films 15 are in contact with the n$^+$-type source regions 7. Further, a barrier metal 14 is provided between the interlayer insulating film 11 and the Ni silicide films 15.

In this manner, in the embodiment, the NiAl silicide films 20 constitute a metal in contact with the p$^+$-type contact regions 8. As a result, contact resistance of the p+-type contact regions 8 may be reduced, enabling reduction of the VF of the body diode. Therefore, heat generated during body diode (BD) screening is reduced, it becomes possible for large current to flow during the BD screening, and the screening time may be shortened.

Furthermore, due to the reduction of the contact resistance of the p+-type contact regions 8, loss during switching may be reduced. The contact resistance of the p+-type contact regions 8 is reduced, whereby a predetermined design value for surge current capability (IFSM) may be obtained.

Further, the source electrodes 12 are electrically insulated from the gate electrodes 10 by the interlayer insulating film 11. An AlSi film 19 constituting a source electrode pad is provided on the source electrodes 12. Between the interlayer insulating film 11 and the source electrodes 12, for example, a Ti/TN film 14 constituting a barrier metal that prevents diffusion of metal atoms from the source electrodes 12 to the gate electrodes 10 is provided. The barrier metal 14 covers an entire area of sidewalls of the interlayer insulating film 11, whereby the interlayer insulating film 11 is not in direct contact with the Ni silicide films 15 or the NiAl silicide films 20.

Figure 4:
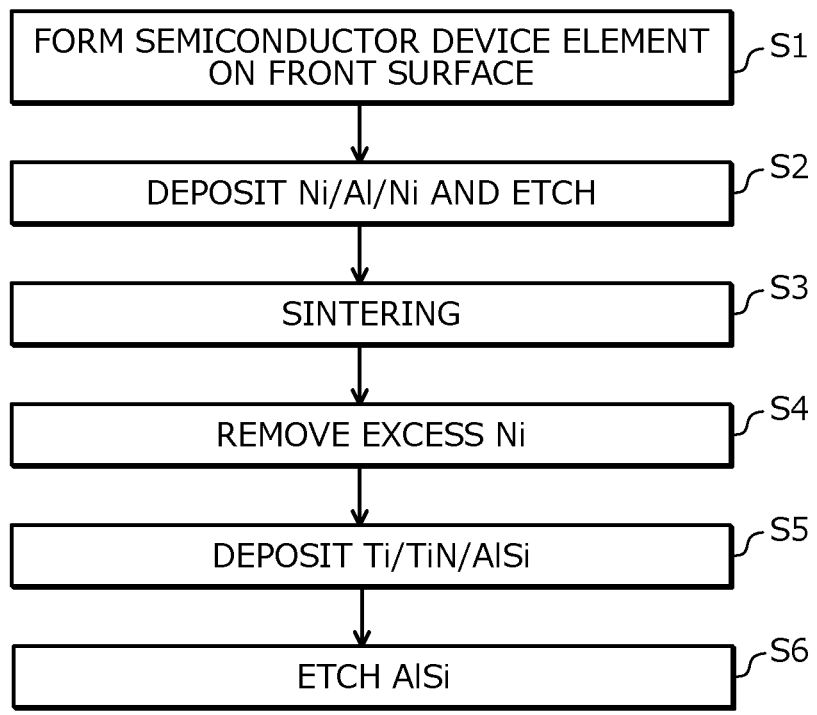
FIG. 4 is a flowchart of an outline of a method of manufacturing the silicon carbide semiconductor device according to the embodiment.
Figure 5:
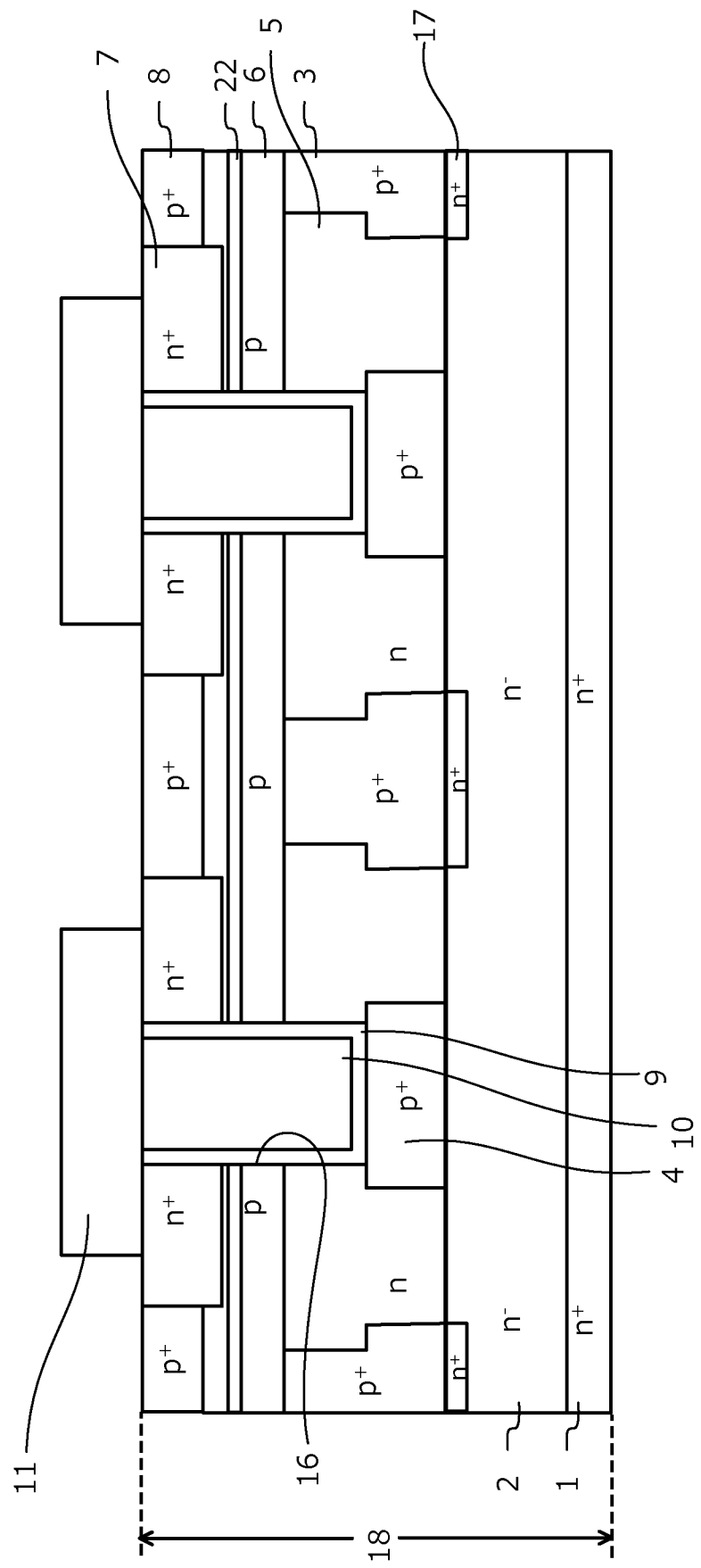
FIG. 5 is a cross-sectional view depicting a state of the silicon carbide semiconductor device according to the embodiment during manufacture.
Figure 6:
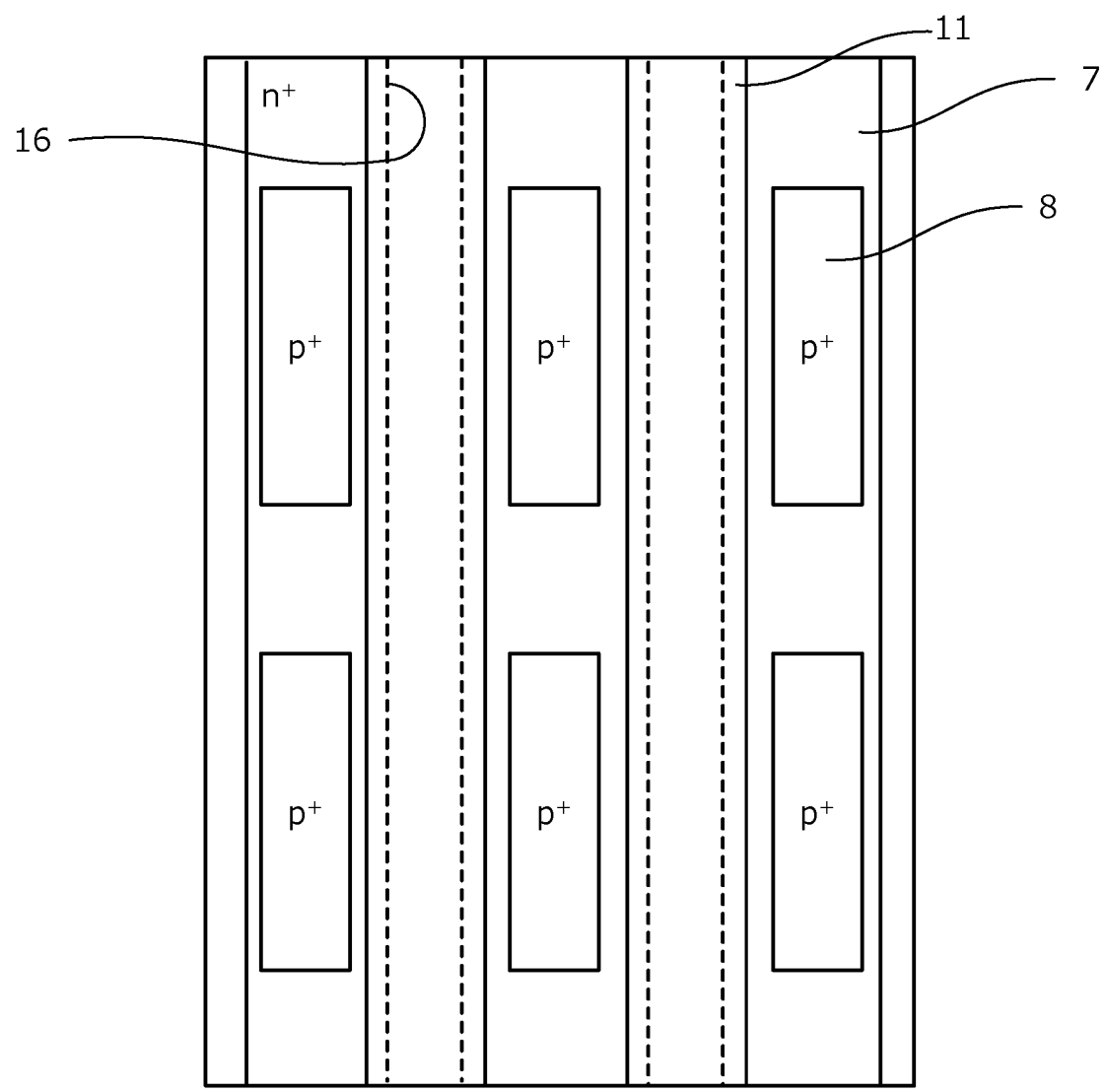
FIG. 6 is a top view depicting a state of the silicon carbide semiconductor device according to the embodiment during manufacture.
Figure 7:
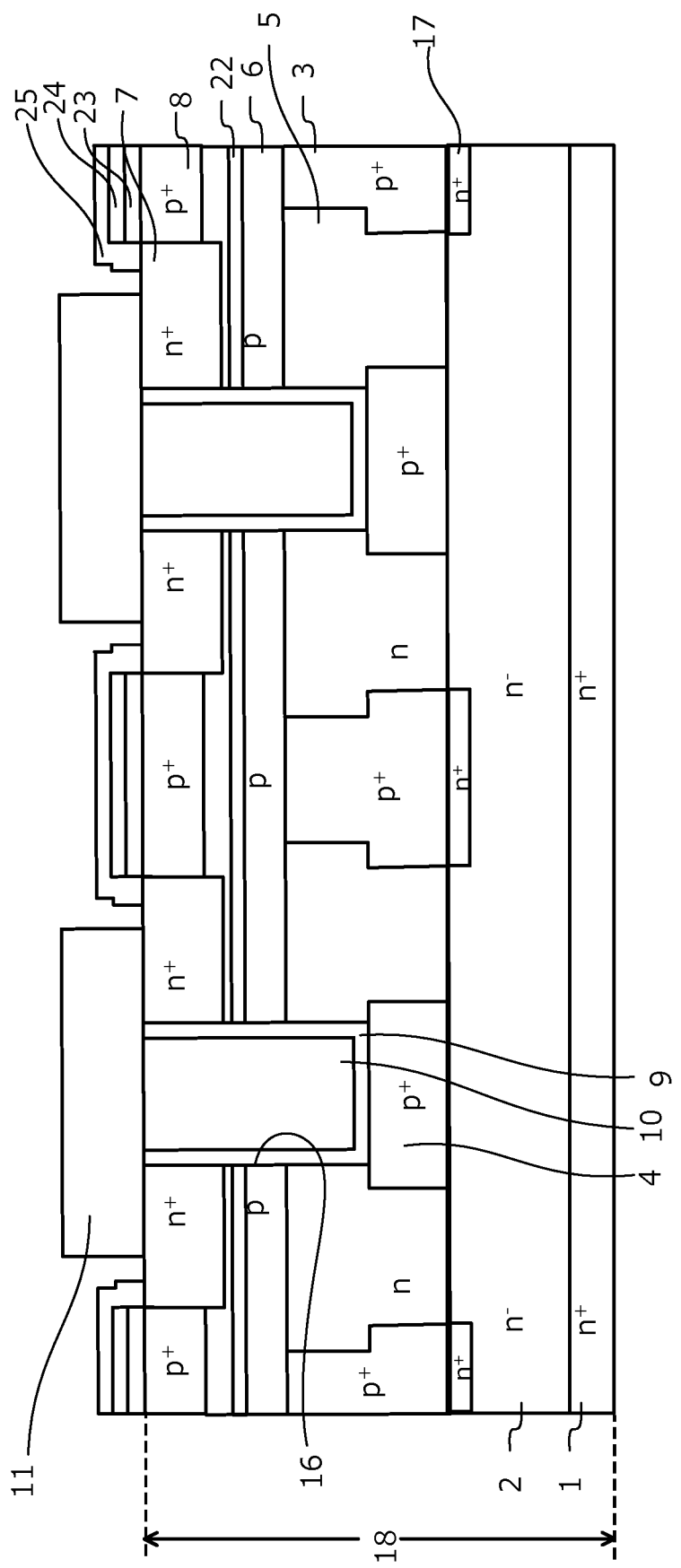
FIG. 7 is a cross-sectional view depicting a state of the silicon carbide semiconductor device according to the embodiment during manufacture.
Figure 8:
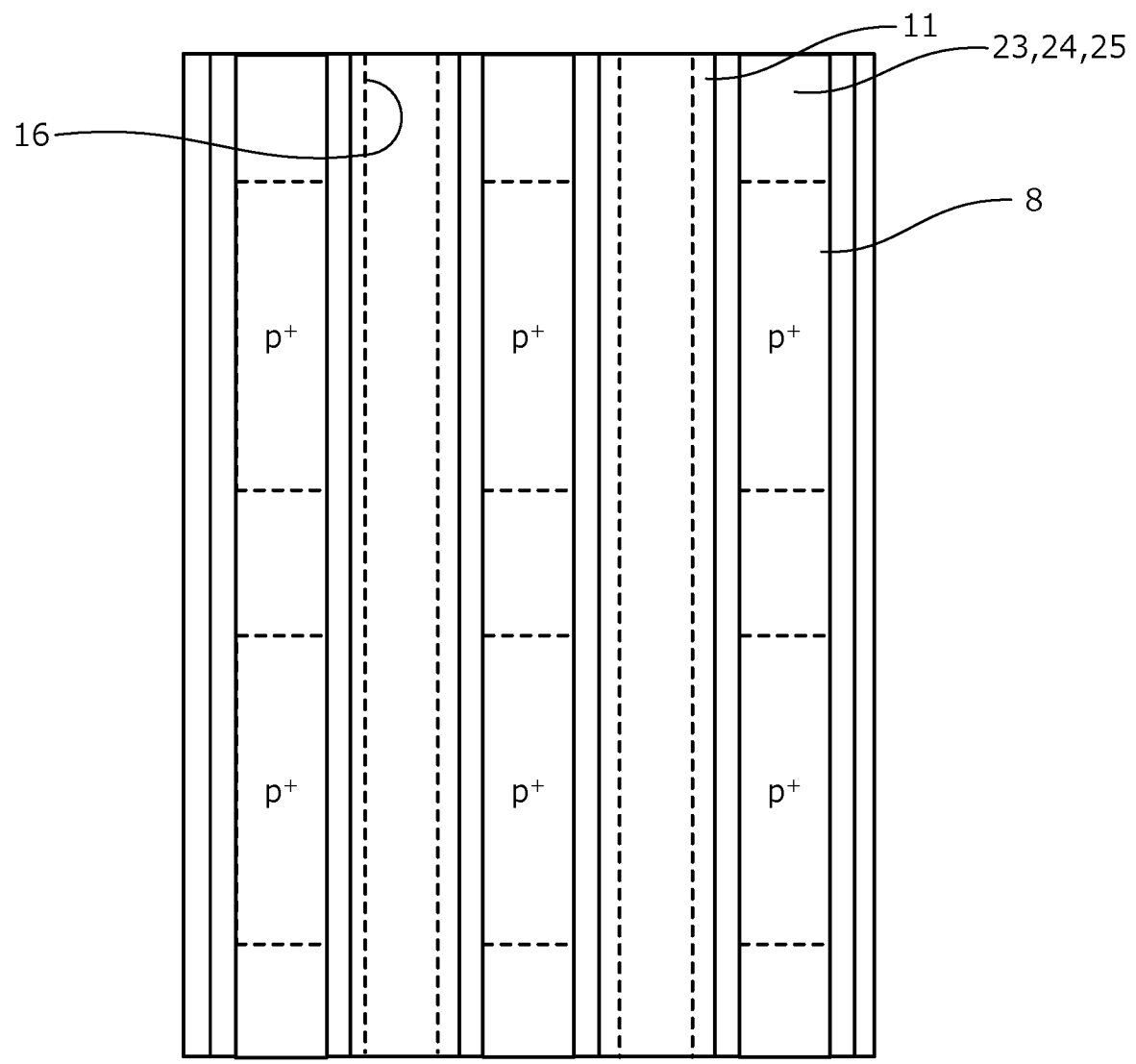
FIG. 8 is a top view depicting a state of the silicon carbide semiconductor device according to the embodiment during manufacture.
Figure 9:
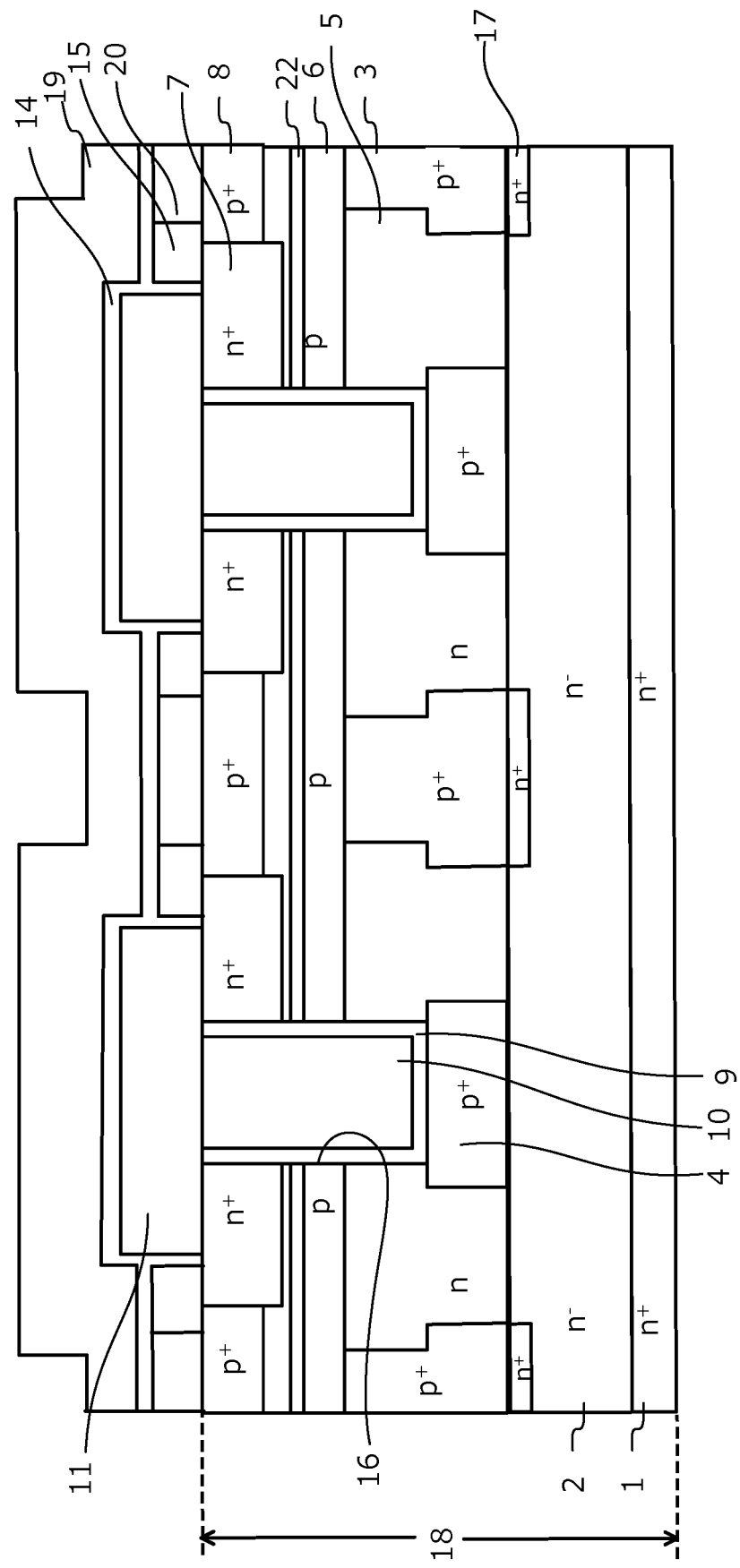
FIG. 9 is a cross-sectional view depicting a state of the silicon carbide semiconductor device according to the embodiment during manufacture.
Figure 10:
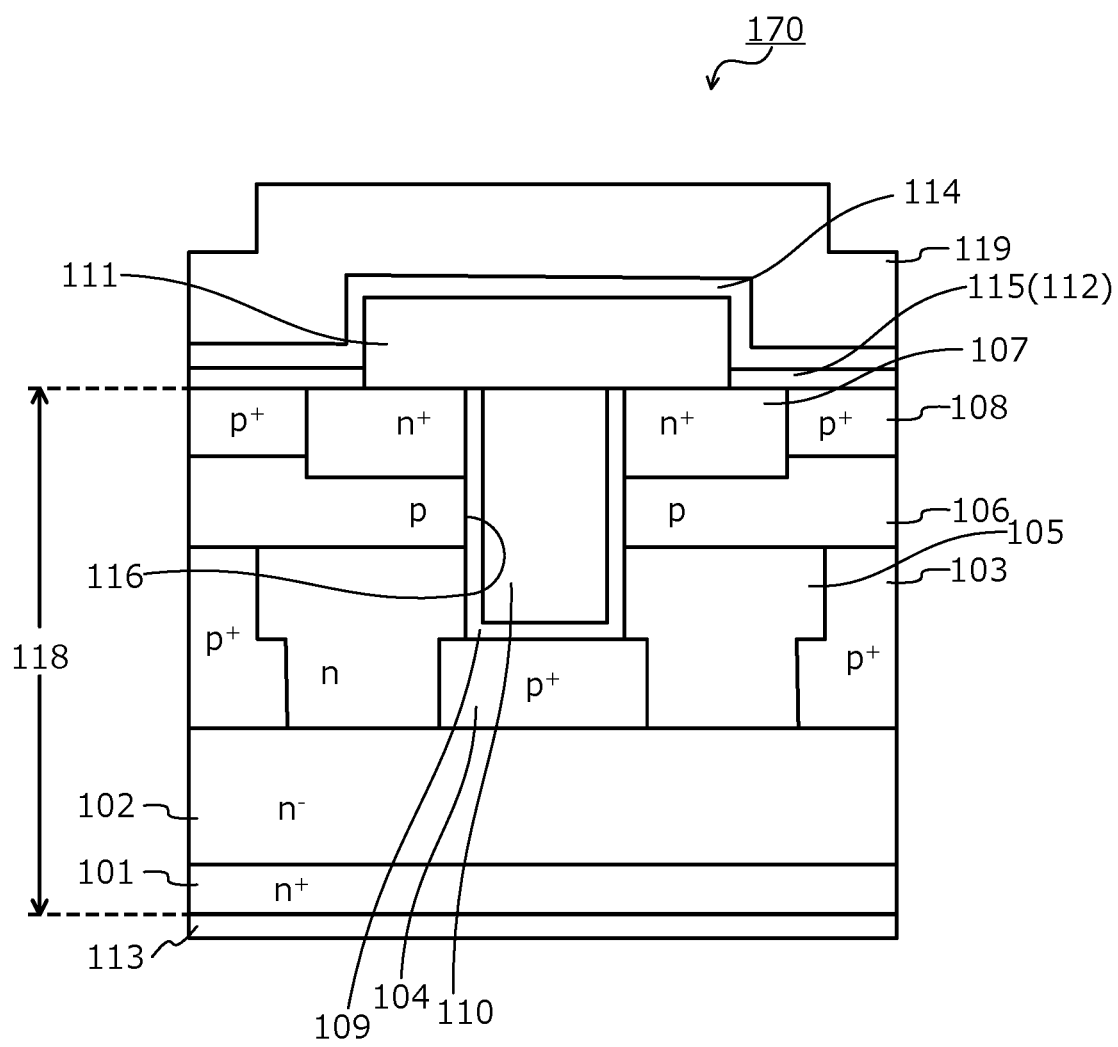
FIG. 10 is a cross-sectional view depicting a structure of a conventional silicon carbide semiconductor device.
Figure 11:
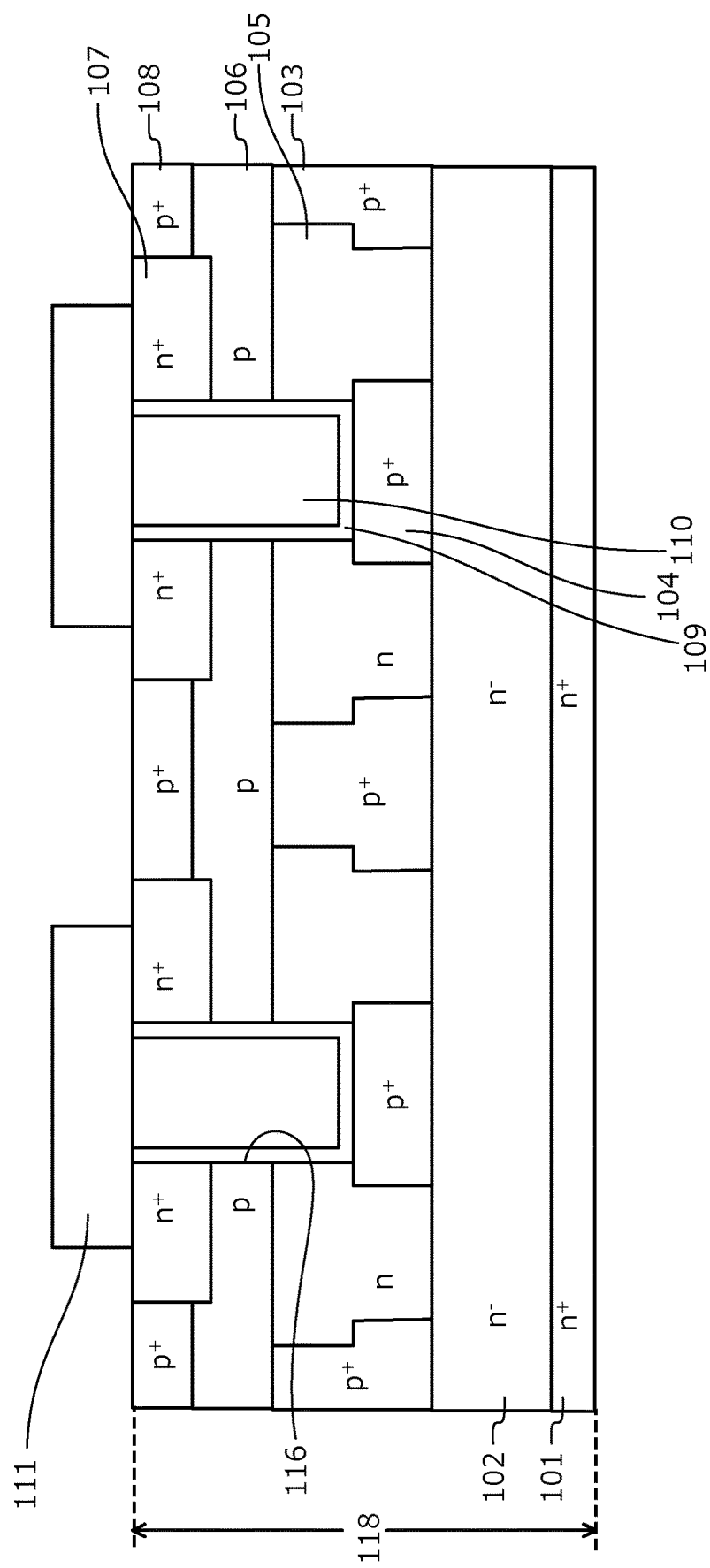
FIG. 11 is a cross-sectional view depicting a state of the conventional silicon carbide semiconductor device during manufacture.
Figure 12:
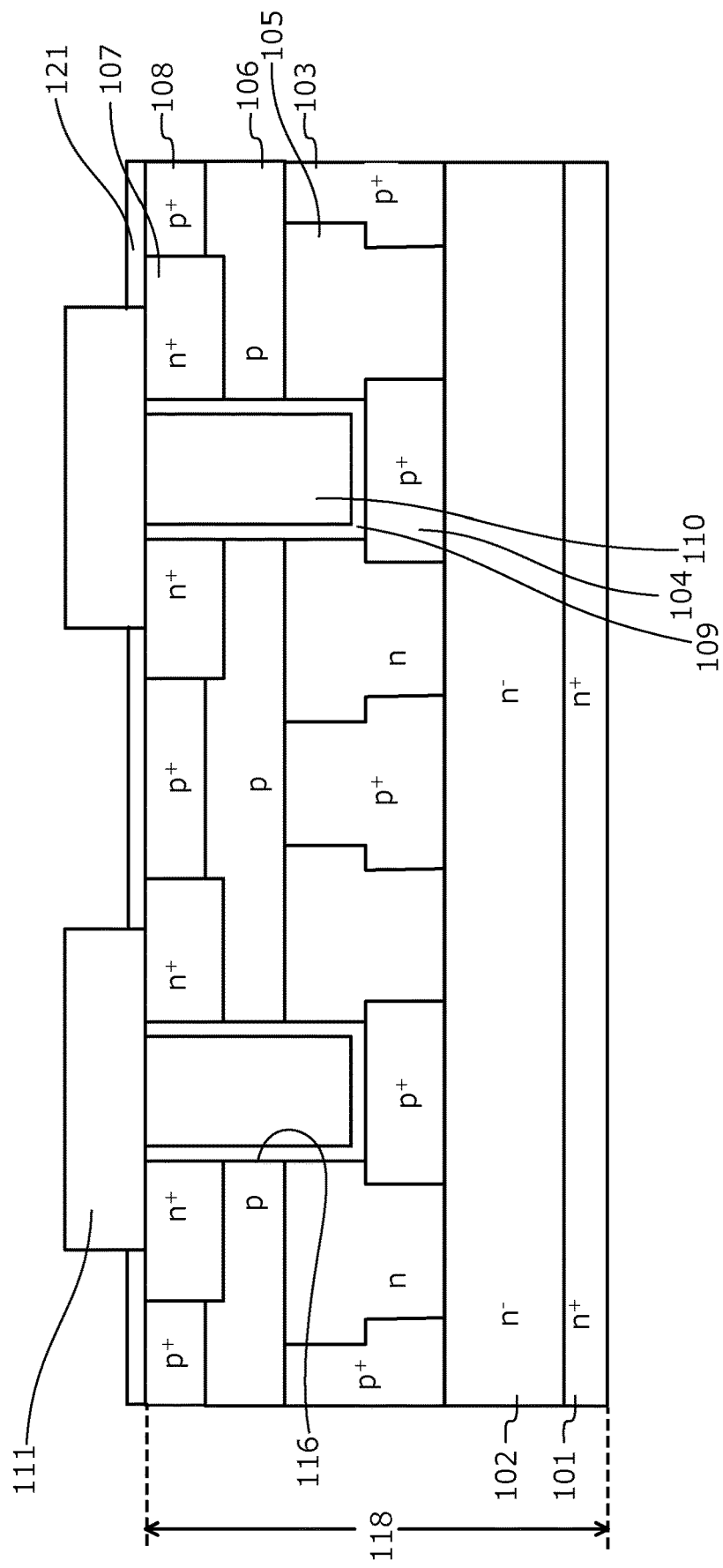
FIG. 12 is a cross-sectional view depicting a state of the conventional silicon carbide semiconductor device during manufacture.
Figure 13:
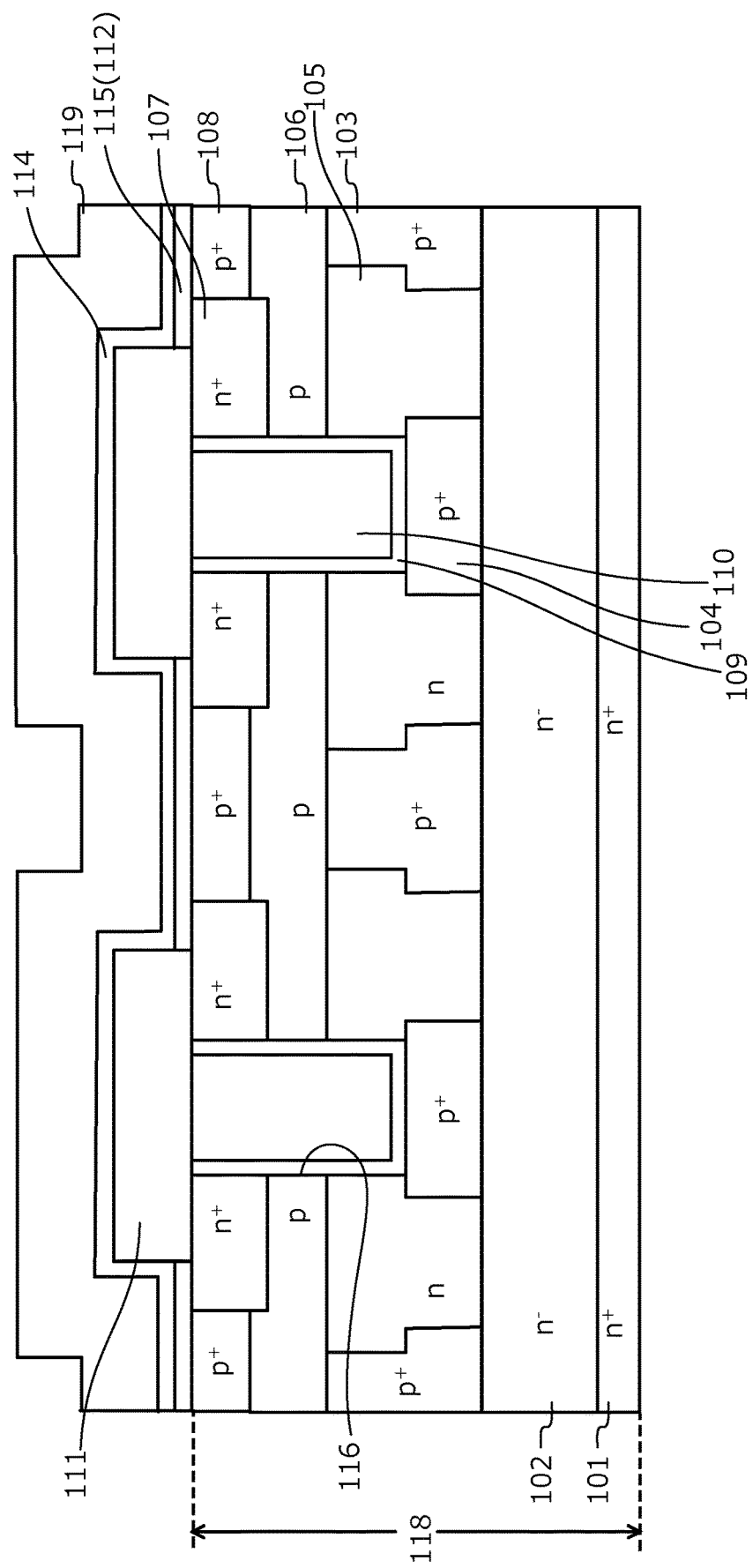
FIG. 13 is a cross-sectional view depicting a state of the conventional silicon carbide semiconductor device during manufacture.

Next, a method of manufacturing the silicon carbide semiconductor device according to the embodiment is described. FIG. 4 is a flowchart of an outline of the method of manufacturing the silicon carbide semiconductor device according to the embodiment. FIGS. 5, 7, and 9 are cross-sectional views depicting states of the silicon carbide semiconductor device according to the embodiment during manufacture. FIGS. 6 and 8 are top views depicting states of the silicon carbide semiconductor device according to the embodiment during manufacture.

First, the n+-type silicon carbide substrate 1 containing an n-type silicon carbide is prepared. Next, on the front surface (first main surface) of the n+-type silicon carbide substrate 1, the semiconductor device element is formed (step S1, first to fifth processes). Hereinafter, details of processes for forming the semiconductor device element are described. On the first main surface of the n+-type silicon carbide substrate 1, a lower n-type silicon carbide epitaxial layer (not depicted) containing silicon carbide is epitaxially grown to a thickness of about, for example, 30 μm while an n-type impurity, for example, nitrogen atoms (N), is doped.

Next, on the surface of the lower n−-type silicon carbide epitaxial layer, a non-depicted mask having predetermined openings is formed by a photolithographic technique using, for example, an oxide film. Subsequently, by ion implantation using the oxide film as a mask, an n-type impurity, for example, nitrogen atoms may be ion implanted. As a result, the n+-type regions 17 are formed in the lower n−-type silicon carbide epitaxial layer.

Next, the mask used during the ion implantation for forming the n+-type regions 17 is removed. Next, a mask having predetermined openings is formed by a photolithographic technique using, for example, an oxide film. Subsequently, a p-type impurity such as aluminum is implanted in the openings of the oxide film, thereby forming lower first p+-type base regions (not depicted) and the second p+-type base regions 4 at a depth of about 0.5 μm. In an instance in which the n+-type regions 17 are formed, on first surfaces of the n+-type regions 17, opposite to second surfaces thereof facing the n+-type silicon carbide substrate 1, the lower first p+-type base regions are formed overlapping the n+-type regions 17.

Next, the ion implantation mask may be partially removed and an n-type impurity such as nitrogen may be ion implanted in the openings, whereby in a portion of a surface region of the lower n−-type silicon carbide epitaxial layer, a lower n-type high-concentration region may be formed at a depth of, for example, about 0.5 μm. An impurity concentration of the lower n-type high-concentration region is set to be, for example, about $1\times10^{17}/cm^3$.

Next, on the surface of the lower n−-type silicon carbide epitaxial layer, an upper n−-type silicon carbide epitaxial layer doped with an n-type impurity such as nitrogen is formed having a thickness of about 0.5 μm. An impurity concentration of the upper n−-type silicon carbide epitaxial layer is set to be about $8\times10^{15}/cm^3$. Hereinafter, the lower n−-type silicon carbide epitaxial layer and the upper n−-type silicon carbide epitaxial layer combined constitute the n−-type silicon carbide epitaxial layer 2.

Next, on the surface of the upper n−-type silicon carbide epitaxial layer, an ion implantation mask having predetermined openings is formed by photolithography using, for example, an oxide film. Subsequently, a p-type impurity such as aluminum is implanted in the openings of the oxide film, whereby upper first p+-type base regions (not depicted) are formed at a depth of about 0.5 μm, so as to overlap the lower first p+-type base regions. The upper first p+-type base regions and the lower first p+-type base regions form continuous regions constituting the first p+-type base regions 3. An impurity concentration of the upper first p+-type base regions is set to be, for example, about $5\times10^8/cm^3$.

Next, the ion implantation mask may be partially removed, an n-type impurity such as nitrogen may be ion implanted in the openings, whereby in in a portion of a surface region of the n−-type silicon carbide epitaxial layer 2, an upper n-type high-concentration region may be formed at a depth of, for example, about 0.5 μm. An impurity concentration of the upper n-type high-concentration region is set to be, for example, about $1\times10^{17}/cm^3$. The upper n-type high-concentration region and the lower n-type high-concentration region are formed to at least partially contact each other, whereby the n-type high-concentration region 5 is formed. Nonetheless, the n-type high-concentration region 5 may be formed on an entire area of the substrate surface or may be omitted.

Next, on the surface of the n−-type silicon carbide epitaxial layer 2, the p-type base layer 6 is formed by epitaxial growth to have a thickness of about 1.1 μm. An impurity concentration of the p-type base layer 6 is set to be in a range of about $5\times10^{15}/cm^3$ to $5\times10^{16}/cm^3$.

Next, a p-type impurity such as aluminum is implanted from the surface of the p-type base layer 6, whereby the implanted channel portion 22 is formed in the p-type base layer 6. An impurity concentration of the implanted channel portion 22 is set to be about $1\times10^{17}/cm^3$.

Next, in a first main surface layer (surface layer of the p-type base layer 6) of the silicon carbide semiconductor base 18, predetermined regions configuring the MOS gates are formed. In particular, on the surface of the p-type base layer 6, an ion implantation mask having predetermined openings is formed by photolithography using, for example, an oxide film. An n-type impurity such as nitrogen (N), phosphorus (P), or the like is ion implanted in the openings, thereby forming the n+-type source regions 7 in surface portions of the p-type base layer 6. Next, the ion implantation mask used to form the n+-type source regions 7 is removed and by a same method, an ion implantation mask having predetermined openings is formed, a p-type impurity such as boron is ion implanted in surface portions of the p-type base layer 6, thereby forming the p+-type contact regions 8. An impurity concentration of the p+-type contact regions 8 is set to be higher than the impurity concentration of the p-type base layer 6.

Next, a heat treatment (activation annealing) for activating all the regions formed by ion implantation is performed. For example, a heat treatment (annealing) under an inert gas atmosphere of about 1700 degrees C. is performed, thereby implementing an activation treatment for the first p+-type base regions 3, the second p+-type base regions 4, the n+-type source regions 7, and the p+-type contact regions 8. As described above, the ion implanted regions may be collectively activated by a single session of the heat treatment or the heat treatment may be performed each time ion implantation is performed.

Next, on the surface of the p-type base layer 6, a trench formation mask having predetermined openings is formed by photolithography using, for example, an oxide film. Next, by dry etching, the trenches 16 that penetrate through the p-type base layer 6 and reach the n-type high-concentration region 5 (2) are formed. The bottoms of the trenches 16 may reach the second p+-type base regions 4 formed in the n-type high-concentration region 5 (2). Next, the trench formation mask is removed. Next, for example, RCA cleaning (wet cleaning using a strong acid and high-base solution) is performed with respect to the front surface of the silicon carbide semiconductor base 18.

Next, the gate insulating film 9 is formed along the surfaces of the n+-type source regions 7 and the bottoms and the sidewalls of the trenches 16. First, an oxide film is deposited in the trenches 16 by a chemical reaction (chemical vapor deposition method) such as high-temperature oxidation such as that for a high temperature oxide (HTO) or thermal oxidation of temperature of about 1000 degrees C., under an oxygen atmosphere.

Next, sacrificial oxidation for rounding corners of the trench openings and the trench bottoms may be performed. Next, an annealing treatment is performed with respect to the oxide film. In an instance of formation by thermal oxidation, interface level density of an interface between the oxide film and a semiconductor portion may be reduced by a heat treatment (post oxidation anneal (POA) treatment). In an instance in which the oxide film is formed by a deposition method such as that for a HTO, to improve electrical characteristics (mobility, etc.), in general, after HTO deposition, post-annealing by a gas containing nitrogen ($N_2$) or the like is performed. For example, NO annealing is performed for about 30 minutes by a NO10%/$N_2$ gas, at a temperature of 1300 degrees C. As a result, the gate insulating film 9 is formed.

Next, on the gate insulating film 9, for example, a polycrystal silicon layer doped with phosphorus atoms is provided. The polycrystal silicon layer may be formed so as to be embedded in the trenches 16. The polycrystal silicon layer is patterned by photolithography and left in the trenches 16, thereby forming the gate electrodes 10.

Next, for example, a phosphate glass is deposited so as to have a thickness of about 1 μm and so as to cover the gate insulating film 9 and the gate electrodes 10, whereby the interlayer insulating film 11 is formed. The interlayer insulating film 11 and the gate insulating film 9 are patterned by photolithography, thereby forming contact holes that expose the n+-type source regions 7 and the p+-type contact regions 8. Thereafter, a heat treatment (reflow) is performed, thereby planarizing the interlayer insulating film 11. The state up to here is depicted in FIGS. 5 and 6.

Next, the interlayer insulating film 11 is selectively removed and on the surface of the silicon carbide semiconductor base 18, a lower Ni film 23, an Al film 24, and an upper Ni film 25 are deposited sequentially and etched (step S2, sixth process). The lower Ni film 23 is deposited by sputtering to be in a range, for example, from 50 nm to 120 nm. The Al film 24 is deposited by sputtering to be in a range, for example, from 50 nm to 120 nm. The upper Ni film 25 is deposited by sputtering to be in a range, for example, from 50 nm to 100 nm. In the instances depicted in FIGS. 2 and 3, other than Ni, the upper Ni film 25 may be a metal with a high melting point of at least 1400 degrees C. such as, for example, titanium (Ti) or molybdenum (Mo).

In an instance of the structure depicted in FIG. 1, the lower Ni film 23 and the Al film 24 are deposited on an entire area of the surface, are etched by photolithography, and are left only on upper surface sides of the p+-type contact regions 8; then, the upper Ni film 25 is deposited on an entire area of the surface, is etched by photolithography, and is left only on upper surface sides of the p+-type contact regions 8 and the n+-type source regions 7 (eighth process). At this time, the upper Ni film 25 is etched so as to be apart from the interlayer insulating film 11. The state up to here is depicted in FIGS. 7 and 8.

In an instance of the structure depicted in FIG. 2, the lower Ni film 23, the Al film 24, and the upper Ni film 25 are deposited on an entire area of the surface, are etched by photolithography, and are left only on upper surface sides of the p+-type contact regions 8 and the n+-type source regions 7 (eighth process). At this time, the lower Ni film 23, the Al film 24, and the upper Ni film 25 are all etched to be apart from the interlayer insulating film 11. The state up to here is not depicted for the instance of the structure depicted in FIG. 2.

In an instance of the structure depicted in FIG. 3, the lower Ni film 23 is deposited in an entire area of the surface, is etched by photolithography, and is left only in the upper surface sides of the p+-type contact regions 8 and the n+-type source regions 7; then, the Al film 24 and the upper Ni film 25 are deposited on an entire area of the surface, are etched by photolithography, and are left only on the upper surface sides of the p+-type contact regions 8 (eighth process). At this time, the lower Ni film 23 is etched so as to be apart from the interlayer insulating film 11. The state up to here is not depicted for the instance of the structure depicted in FIG. 3.

Next, sintering is performed by a heat treatment (step S3, ninth process). As a result, at the 3-layer film portion of the lower Ni film 23, the Al film 24, and the upper Ni film 25, the 3-layer film reacts with SiC of the surfaces of the n+-type source regions 7 or the p+-type contact regions 8 and forms a silicide, whereby the NiAl silicide films 20 are formed. At the single-layer film portion of the lower Ni film 23 or the upper Ni film 25, the single layer film reacts with the SiC of the surfaces of the n+-type source regions 7, whereby the Ni silicide films 15 are formed. A temperature of the heat treatment may be preferably, for example, in a range of 800 degrees C. to 1000 degrees C. Below 800 degrees C., sintering is not sufficiently performed, whereby the Ni silicide films 15 may peel; at 1000 degrees C. or higher, the upper Ni film 25 reacts, forming a silicide, composition of the upper Ni film 25 changes, and the density decreases, whereby coverage becomes poor.

In this manner, in the embodiment, high-temperature sintering is performed one time. Therefore, thermal diffusion of Al of the Al film 24 into the lower Ni film 23 is facilitated, enabling reduction of the contact resistance.

Next, unreacted excess Ni and excess Al in the sintering process at step S3 are removed (step S4). Next, Ti, TiN, and AlSi are deposited in an entire area of the surface (step S5, tenth process). As a result, the Ti/TiN film 14 constituting the barrier metal and the AlSi film 19 are formed. At this stage, the Ti/TiN film 14 is embedded between the interlayer insulating film 11 and the Ni silicide films 15. The state up to here is depicted in FIG. 9.

Next, the Ti/TiN film 14 and the AlSi film 19 are etched (step S6, eleventh process). The Ti/TiN film 14 and the AlSi film 19 are selectively removed and left so as to cover an entire area of an active portion of the device element, whereby the source electrode pad and a gate electrode pad are formed.

Next, on the second main surface of the $n^+$-type silicon carbide substrate 1, the back electrode 13 constituted by, for example, a nickel (Ni) film is formed. Thereafter, for example, laser annealing is performed, forming an ohmic junction between the $n^+$-type silicon carbide substrate 1 and the back electrode 13.

Next, on the surface of the back electrode 13, for example, titanium (Ti), nickel (Ni), and gold (Au) are sequentially deposited as the drain electrode pad (not depicted). Thus, as described above, the semiconductor device depicted in FIGS. 1 to 3 is completed.

As described above, according to the embodiment, the metal in contact with the $p^+$-type contact regions is the NiAl silicide film. As a result, the contact resistance of the $p^+$-type contact regions may be reduced, whereby the VF of the body diode may be reduced. Thus, the heat generated during the BD screening decreases, it becomes possible for a large current to pass during the BD screening, and the screening time may be shortened.

Further, formation of the Ni silicide film is performed by a single session of the high-temperature sintering. Therefore, thermal diffusion of the Al of the Al film into the lower Ni film is facilitated, enabling reduction of the contact resistance.

In the foregoing, the present invention may be variously modified within a range not departing from the spirit of the invention and in the embodiments, for example, dimensions, impurity concentrations, etc. of parts are variously set according to necessary specifications. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the metal in contact with the $p^+$-type contact regions (second semiconductor regions of the second conductivity type) has the 3-layer structure constituted by the Ni silicide film, the Al film, and the Ni film. As a result, the contact resistance of the $p^+$-type contact regions may be reduced, and the VF of the body diode may be reduced. Thus, the heat generated during the BD screening decreases, it becomes possible for a large current to flow during the BD screening, and the screening time may be shortened.

Further, the formation of the Ni silicide film is performed by the single session of the high-temperature sintering. Therefore, thermal diffusion of the Al in the Al film into the lower Ni film is facilitated and the contact resistance may be reduced.

The method of manufacturing a silicon carbide semiconductor device and the silicon carbide semiconductor device according to the present invention achieve an effect in that the VF of the built-in diode may be reduced by introducing the Ni/Al/Ni structure on the $p^+$-type contact regions.

As described, the method of manufacturing a silicon carbide semiconductor device and the silicon carbide semiconductor device according to the present invention are useful for power semiconductor devices used in power converting equipment such as inverters, power source devices of various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, the silicon carbide semiconductor substrate having a first main surface and a second main surface that are opposite to each other;
a first semiconductor layer of the first conductivity type, provided on the first main surface of the silicon carbide semiconductor substrate, the first semiconductor layer having an impurity concentration that is lower than an impurity concentration of the silicon carbide semiconductor substrate, the first semiconductor layer having a first surface and a second surface that are opposite to each other, the second surface facing the silicon carbide semiconductor substrate;
a second semiconductor layer of a second conductivity type, provided on the first surface of the first semiconductor layer, the second semiconductor layer having a first surface and a second surface that are opposite to each other, the second surface facing the silicon carbide semiconductor substrate;
a plurality of first semiconductor regions of the first conductivity type, selectively provided in the second semiconductor layer, at the first surface of the second semiconductor layer;
a plurality of second semiconductor regions of the second conductivity type, in contact with the first semiconductor regions selectively provided in the second semiconductor layer, at the first surface of the second semiconductor layer;
a gate electrode contacting, via a gate insulating film, at least a portion of the second semiconductor layer positioned between the first semiconductor regions and the first semiconductor layer;
an interlayer insulating film covering the gate electrode;
a plurality of first electrodes provided at surfaces of the first semiconductor regions and the second semiconductor regions; and
a second electrode provided on the second main surface of the silicon carbide semiconductor substrate, wherein
each of the first electrodes contain includes an NiAl silicide film and is apart from the interlayer insulating film.

2. The silicon carbide semiconductor device according to claim 1, further comprising
a barrier metal provided between the interlayer insulating film and the first electrodes.

3. A method of manufacturing the silicon carbide semiconductor device according to claim 1, the method comprising:
preparing the silicon carbide semiconductor substrate;
forming the first semiconductor layer on the first main surface of the silicon carbide semiconductor substrate;

forming the second semiconductor layer on the first surface of the first semiconductor layer;

selectively forming the first semiconductor regions in the second semiconductor layer, at the first surface thereof;

selectively forming the second semiconductor regions in the second semiconductor layer, at the first surface thereof, to be in contact with the first semiconductor regions;

forming the gate electrode to be in contact with, via the gate insulating film, at least the portion of the second semiconductor layer;

forming the interlayer insulating film so as to cover the gate electrode;

forming the first electrodes at the surfaces of the first semiconductor regions and the second semiconductor regions;

depositing a Ti film, a TiN film, and an AlSi film above the first surface of the second semiconductor layer;

etching the AlSi film; and forming the second electrode on the second main surface of the silicon carbide semiconductor substrate, wherein forming each of the plurality of first electrodes includes:
   depositing a lower Ni film, an Al film, and an upper Ni film above the first surface of the second semiconductor layer and etching the lower Ni film, the Al film, and the upper Ni film, so as to be apart from the interlayer insulating film, as a depositing and etching process; and
   sintering the lower Ni film, the Al film, and the upper Ni film by a heat treatment and thereby forming the NiAl silicide film.

4. The method according to claim 3, wherein
the depositing and etching process includes:
   depositing the lower Ni film and the Al film above the first surface of the second semiconductor layer,
   etching the lower Ni film and the Al film to be left only on the surfaces of the second semiconductor regions,
   depositing the upper Ni film above the first surface of the second semiconductor layer, and
   etching the upper Ni film so as to be left only on the surfaces of the first semiconductor regions and the Al film.

5. The method according to claim 3, wherein
the depositing and etching process includes:
   depositing the lower Ni film, the Al film and the upper Ni film above the first surface of the second semiconductor layer, and
   etching the lower Ni film, the Al film, and the upper Ni film so as to be left only on the surfaces of the first semiconductor regions and the second semiconductor regions.

6. The method according to claim 3, wherein
the depositing and etching process includes:
   depositing the lower Ni film above the first surface of the second semiconductor layer,
   etching the lower Ni film to be left only on the surfaces of the first semiconductor regions and the second semiconductor regions,
   depositing the Al film and the upper Ni film above the first surface of the second semiconductor layer, and
   etching the Al film and the upper Ni film so as to be left only on the surfaces of the second semiconductor regions.

7. The method according to claim 3, wherein in the sintering, the heat treatment is performed in a range of 800 degrees C. to 1000 degrees C.

* * * * *